(12) United States Patent
Fang et al.

(10) Patent No.: US 8,988,128 B2
(45) Date of Patent: *Mar. 24, 2015

(54) LEVEL SHIFTER HAVING FEEDBACK SIGNAL FROM HIGH VOLTAGE CIRCUIT

(71) Applicant: International Rectifier Corporation, El Segundo, CA (US)

(72) Inventors: Min Fang, Manhattan Beach, CA (US); Massimo Grasso, Trivolzio (IT); Niraj Ranjan, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/934,499

(22) Filed: Jul. 3, 2013

(65) Prior Publication Data
US 2014/0028371 A1  Jan. 30, 2014

Related U.S. Application Data

(60) Provisional application No. 61/675,932, filed on Jul. 26, 2012.

(51) Int. Cl.
H03L 5/00 (2006.01)
H03K 19/0175 (2006.01)
(52) U.S. Cl.
CPC ............ H03K 19/01759 (2013.01); H03L 5/00 (2013.01)
USPC ................................ 327/333; 326/62; 326/81

(58) Field of Classification Search
USPC .................. 326/62–63, 80–81; 327/306, 333
See application file for complete search history.

(56) References Cited

U.S. PATENT DOCUMENTS

| | | | |
|---|---|---|---|
| 7,031,458 B2 * | 4/2006 | Holcombe et al. | 379/399.02 |
| 7,515,672 B2 * | 4/2009 | Dupuis et al. | 375/377 |
| 8,024,623 B2 | 9/2011 | Ho | |
| 8,228,976 B2 * | 7/2012 | Hsiao et al. | 375/232 |
| 8,373,486 B2 | 2/2013 | Ficke | |
| 8,571,093 B1 | 10/2013 | Van de Beek | |

* cited by examiner

Primary Examiner — Dinh Le
(74) Attorney, Agent, or Firm — Farjami & Farjami LLP

(57) ABSTRACT

According to an exemplary implementation, a level shifter includes a low voltage circuit and a high voltage circuit. The low voltage circuit is configured to provide a differential signal to the high voltage circuit. The high voltage circuit is configured to receive the differential signal from the low voltage circuit so as to level shift the differential signal from a first ground of the low voltage circuit to a second ground of the high voltage circuit. The differential signal is provided by the low voltage circuit responsive to a feedback signal from the high voltage circuit. The feedback signal can indicate common mode noise in the level shifter. Furthermore, the low voltage circuit can be configured to refresh the differential signal responsive to the feedback signal.

20 Claims, 5 Drawing Sheets

US 8,988,128 B2

LEVEL SHIFTER HAVING FEEDBACK SIGNAL FROM HIGH VOLTAGE CIRCUIT

BACKGROUND

The present application claims the benefit of and priority to a pending provisional application entitled "Asynchronous Common Mode Noise Immune Galvanic Isolated Signal Level Shifting," Ser. No. 61/675,932 filed on Jul. 26, 2012. The disclosure in this pending provisional application is hereby incorporated fully by reference into the present application.

Level shifters can be utilized to level shift a signal between circuits that are referenced to different grounds. One or more isolation barriers can provide galvanic isolation between the circuits. Exemplary approaches to galvanic isolation can be based on capacitance, induction, electromagnetic waves, optical, acoustic, and mechanical means to exchange energy between the circuits. In some applications, the level shifter may be in a power system or another noisy environment. For example, the signal may correspond to a control signal for a power switch of a switch mode power supply. In such systems, noise can interfere with the accuracy of the level shifter resulting in distortion. Distortion may not be tolerable in certain applications, such as audio systems where the distortion can increase total harmonic distortion resulting in reduced sound quality.

SUMMARY

A level shifter having feedback signal from a high voltage circuit, substantially as shown in and/or described in connection with at least one of the figures, and as set forth more completely in the claims.

DETAILED DESCRIPTION

Figure 1A:
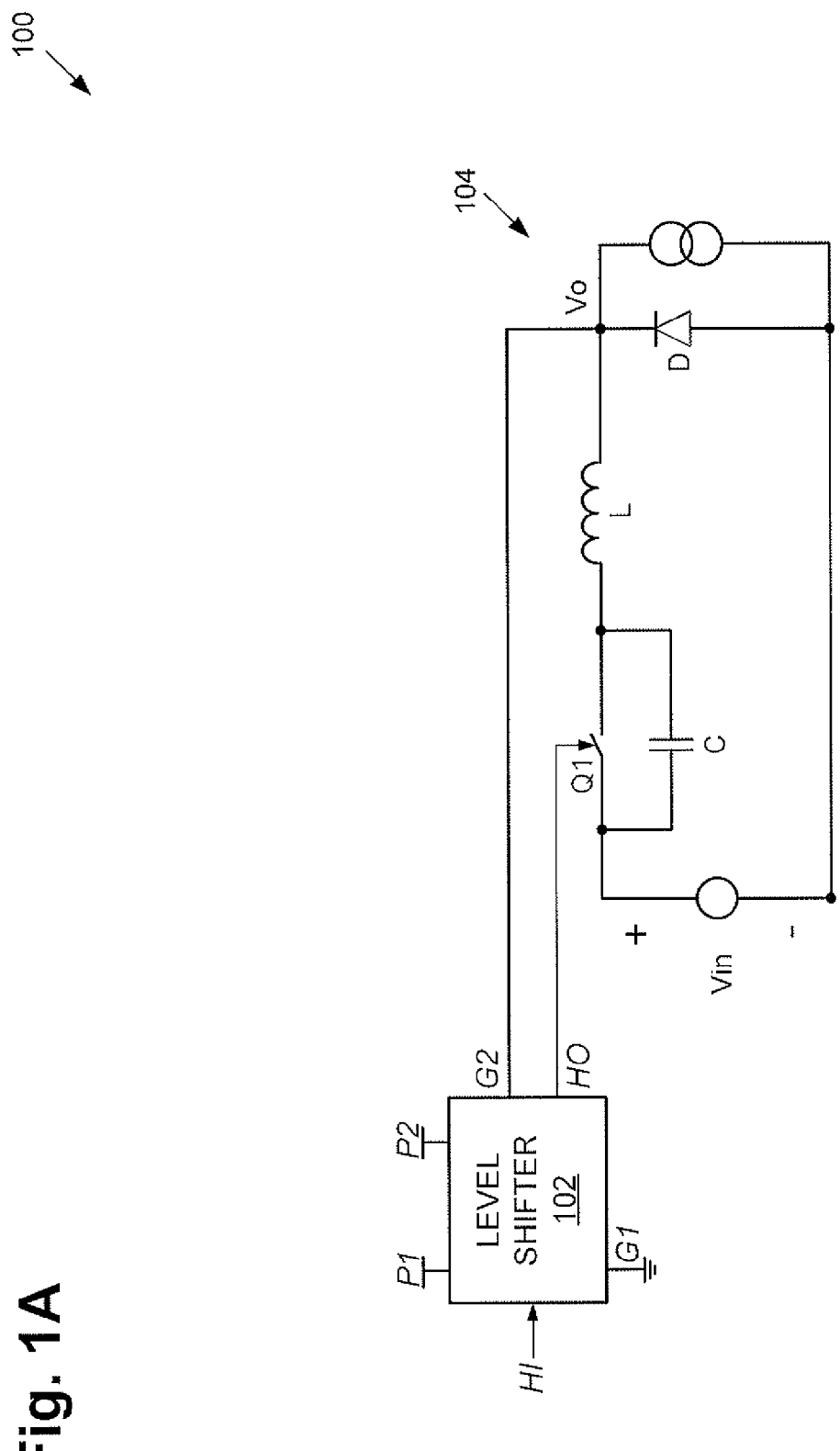
FIG. 1A presents an exemplary system including a level shifter, in accordance with implementations of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A presents an exemplary system including a level shifter, in accordance with implementations of the present disclosure. As shown in FIG. 1A, system 100 includes level shifter 102 and power supply 104. Power supply 104 is a switched mode power supply including input voltage Vin, capacitor C, inductor L, diode D, and power switch Q1.

Level shifter 102 is configured to level shift input signal HI to output signal HO. Output signal HO is referenced to a different ground than input signal HI, such that output signal HO is suitable for driving power switch Q1. As shown in FIG. 1A, input signal HI corresponds to a control signal for power switch Q1 of power supply 104, which is level shifted to output signal HO so as to properly control power switch Q1.

In system 100, input signal HI and output voltage Vo can be, for example, thousands of volts apart. As such, level shifter 102 can be at substantial risk for exposure to noise, which can interfere with the accuracy of level shifter 102. For example, high voltage switching in power supply 104 can introduce common mode noise in level shifter 102. Certain common mode noise in system 100 can be synchronous common mode noise that coincides with input signal HI switching power switch Q1 (or multiple power switches and/or multiple input signals in other power supply topologies). However, other common mode noise in system 100 can be asynchronous common mode noise that does not necessarily coincide with input signal HI switching power switch Q1.

By way of more specific example, asynchronous common mode noise in system 100 may occur in zero voltage switching during OFF time of power switch Q1. During this time, an LC tank formed by capacitor C and inductor L can resonate, and reactivate power switch Q1 causing asynchronous common mode noise. As another example, power supply 104 may include a half-bridge for switching power (e.g. comprising microelectromechanical systems (MEMS) switches) in, for example, a plasma display panel (PDP). In this example, asynchronous common mode noise may result from switching of auxiliary switches that are coupled to the half-bridge.

It should be noted that system 100 includes power supply 104 as an example, which may instead correspond to another circuit receiving output signal HO. Thus, power supply 104 could instead be a circuit that is not a power supply and may more generally correspond to a circuit conducive to causing common mode noise in level shifter 102.

Common mode noise in system 100 can interfere with the ability of level shifter 102 to accurately level shift input signal HI to output signal HO resulting in distortion in output signal HO. The distortion can cause misfire of power switch Q1 or other circuitry being controlled utilizing output signal HO. As such, common mode noise in system 100, and especially asynchronous common mode noise, can cause disruption, loss of functionality, and damage to system 100.

Figure 1B:
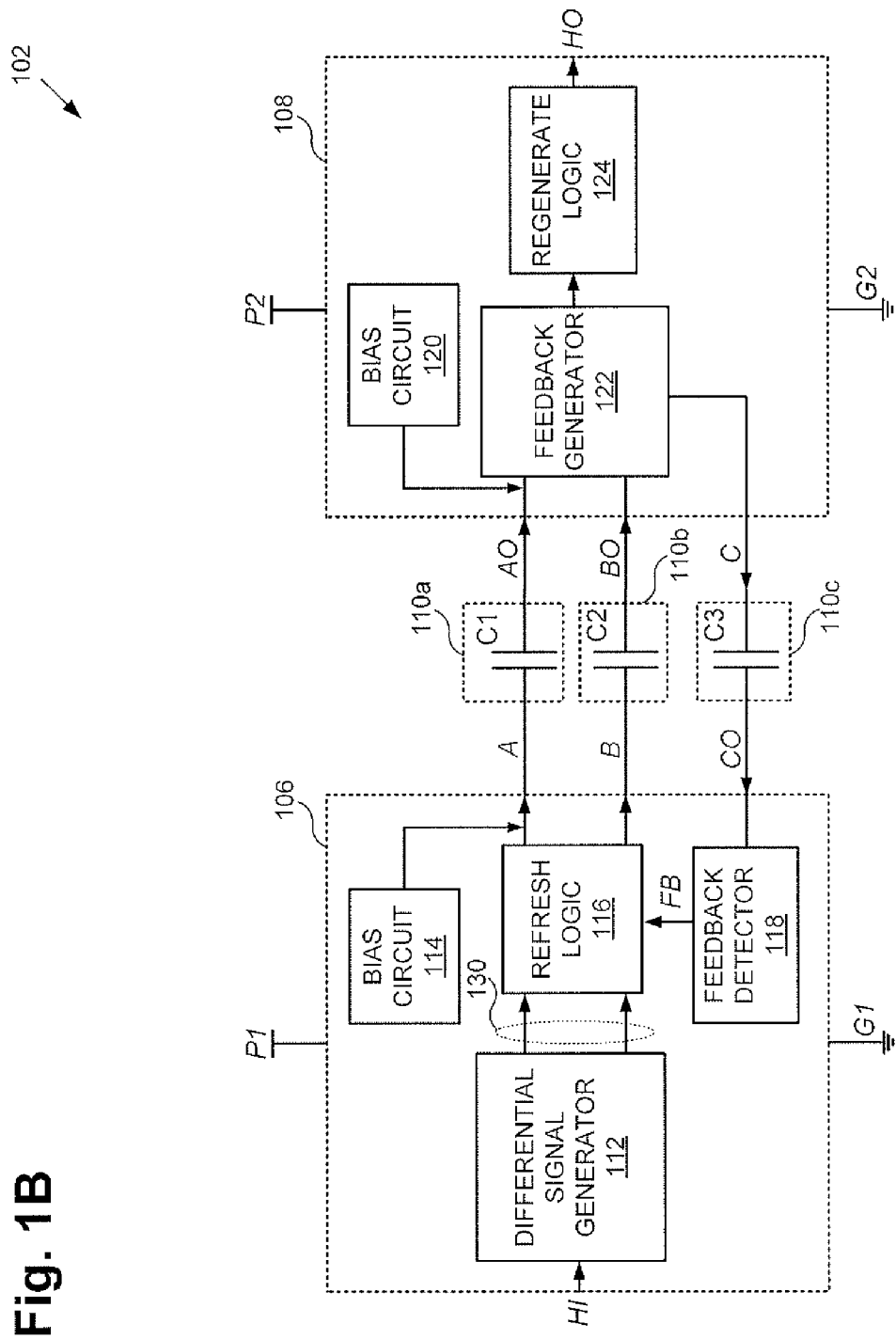
FIG. 1B presents a diagram of an exemplary level shifter, in accordance with implementations of the present disclosure.

Referring now to FIG. 1B, FIG. 1B presents a diagram of an exemplary level shifter, in accordance with implementations of the present disclosure. FIG. 1B shows that level shifter 102 includes low voltage circuit 106, high voltage circuit 108, and isolation barriers 110a, 110b, and 110c.

Low voltage circuit 106 includes differential signal generator 112, bias circuit 114, refresh logic 116, and feedback detector 118. High voltage circuit 108 includes bias circuit 120, feedback generator 122, and regenerate logic 124. Isolation barrier 110a includes at least capacitor C1, isolation barrier 110b includes at least capacitor C2, and isolation barrier 110c includes at least capacitor C3.

In level shifter 102, low voltage circuit 106 is coupled to power P1 and is referenced to ground G1. High voltage circuit 108 is coupled to power P2 and is referenced to ground G2, which can be a floating ground. Low voltage circuit 106 is configured to provide differential signal 130 to high voltage circuit 108. As shown in FIG. 1B, differential signal generator 112 receives input signal HI and generates differential signal 130 from input signal HI. Refresh logic 116 provides differential signal 130 to isolation barriers 110a and 110b as complementary signals A and B utilizing bias circuit 114 and feedback detector 118.

High voltage circuit 108 is configured to receive differential signal 130 from low voltage circuit 106 so as to level shift differential signal 130 from ground G1 of low voltage circuit 106 to ground G2 of high voltage circuit 108. As shown in FIG. 1B, isolation barriers 110a and 110b galvanically isolate low voltage circuit 106 from high voltage circuit 108 in converting complementary signals A and B to complementary signals AO and BO utilizing bias circuit 120.

In the present implementation, differential signal 130 is provided by low voltage circuit 106 responsive to feedback signal FB from high voltage circuit 108. As such, in some implementations, low voltage circuit 106 can adjust complementary signals A and B based on feedback signal FB. In FIG. 1B, low voltage circuit 106 is configured to receive feedback signal FB from high voltage circuit 108 while isolation barrier 110c is galvanically isolating low and high voltage circuits 106 and 108. Feedback signal FB is provided by feedback generator 122 of high voltage circuit 108 in FIG. 1B. However, high voltage circuit 108 may provide feedback signal FB to low voltage circuit 106 from a source external to high voltage circuit 108, such as power supply 104.

In the present implementation, feedback signal FB is provided by high voltage circuit 108 through isolation barrier 110c, which is a dedicated isolation barrier. In other implementations, feedback signal FB is provided by high voltage circuit 108 through at least one shared isolation barrier that is also utilized for other signals. For example, feedback signal FB and differential signal 130 can be communicated through at least one shared isolation barrier. More particularly, feedback signal FB can be provided by high voltage circuit 108 through at least one of isolation barriers 110a and 110b, which are also utilized for complementary signals A and B respectively. In these implementations isolation barrier 110c may not be necessary. Rather, level shifter 102 can employ any of various bidirectional transmission techniques. FIGS. 2A, 2B, 2C, and 2D illustrate examples of level shifters having at least one shared isolation barrier as described above.

Referring to FIGS. 2A, 2B, 2C, and 2D, FIGS. 2A, 2B, 2C, and 2D present diagrams of level shifters having exemplary low and high voltage integrated circuits, in accordance with implementations of the present disclosure.

In FIGS. 2A, 2B, 2C, and 2D, respective level shifters 202a, 202b, 202c, 202d correspond to level shifter 102 in FIGS. 1A and 1B. Level shifters 202a, 202b, 202c, and 202d include low voltage circuit 206 corresponding to low voltage circuit 106 in FIG. 1B and high voltage circuit 208 corresponding to high voltage circuit 108 in FIG. 1B. Also in FIGS. 2A, 2B, 2C, and 2D, isolation barriers 210a and 210b correspond respectively to isolation barriers 110a and 110b in FIG. 1B. While FIGS. 2A, 2B, 2C, and 2D do not show an element corresponding to isolation barrier 110c in FIGS. 1A and 1B, in some implementations a similar element is included and can be configured similar to isolation barriers 210a and 210b or can be configured otherwise.

In FIGS. 2A, 2B, 2C, and 2D, low voltage circuit 206 is on low voltage integrated circuit (IC) 236 and high voltage circuit 208 is on high voltage IC 238. Low voltage IC is coupled between power P1 and ground G1 and high voltage IC is coupled between power P2 and ground G2. Isolation barriers 210a and 210b can be formed in various metal levels of low and high voltage ICs 236 and 238.

FIGS. 2A, 2B, 2C, and 2D illustrate exemplary configurations that may be utilized for isolation barriers in level shifters in accordance with implementations of the present disclosure. In the implementations shown, the isolation barriers are capacitive isolation barriers. Various approaches may be employed so as to achieve proper capacitance for the isolation barriers.

Figure 2A:
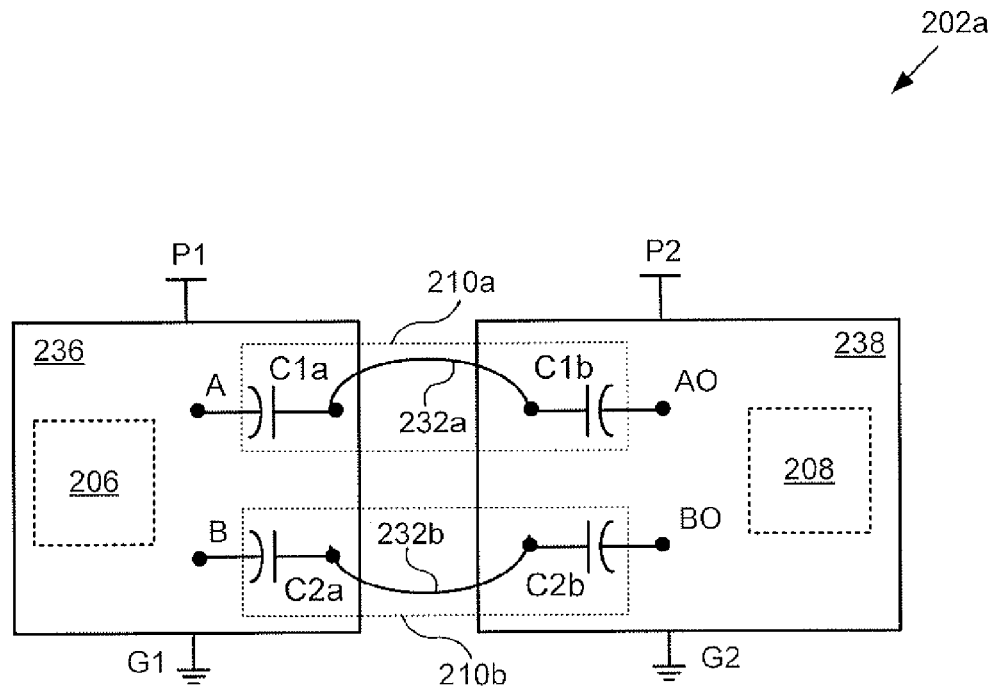
FIG. 2A presents a diagram of a level shifter having exemplary low and high voltage integrated circuits, in accordance with implementations of the present disclosure.

In FIG. 2A, isolation barrier 210a includes capacitors C1a and C1b corresponding to capacitor C1 in FIG. 1B and isolation barrier 210b includes capacitors C2a and C2b corresponding to capacitor C2 in FIG. 1B. Capacitors C1a and C2a are on low voltage IC 236 and capacitors C1b and C2b are on high voltage IC 238. Splitting up isolation barriers 210a and 210b by including capacitors in series can simplify manufacturing of isolation barriers 210a and 210b. As shown in FIG. 2A, capacitors C1a and C1b can be coupled to one another utilizing one or more wirebonds 232a and capacitors C2a and C2b can be coupled to one another utilizing one or more wirebonds 232b.

Figure 2B:
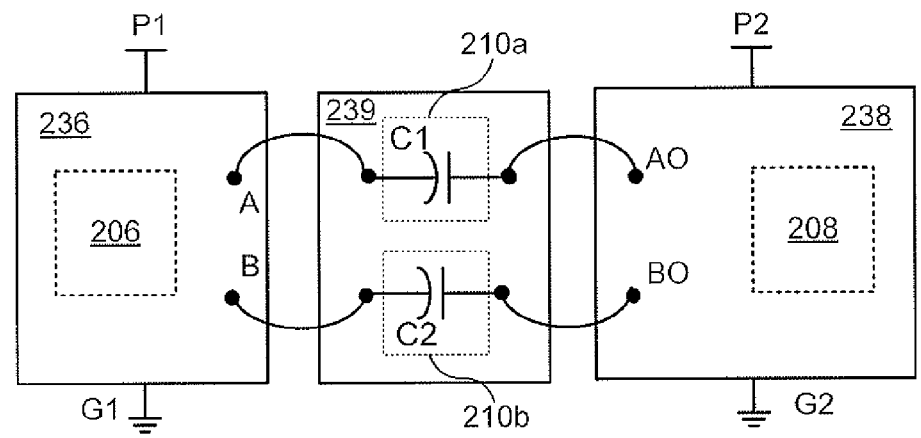
FIG. 2B presents a diagram of a level shifter having exemplary low and high voltage integrated circuits and an isolation barrier integrated circuit, in accordance with implementations of the present disclosure.

In some implementations, isolation barriers 210a and 210b are at least partially on isolation barrier IC 239. Isolation barriers 210a and 210b can be completely on isolation barrier IC 239, as shown in FIG. 2B, or may be distributed across isolation barrier IC 239 and any of low and high voltage ICs 236 and 238. As in FIG. 2A, various wirebonds may be utilized to couple isolation barrier IC 239 and low and high voltage ICs 236 and 238 as shown.

Figure 2C:
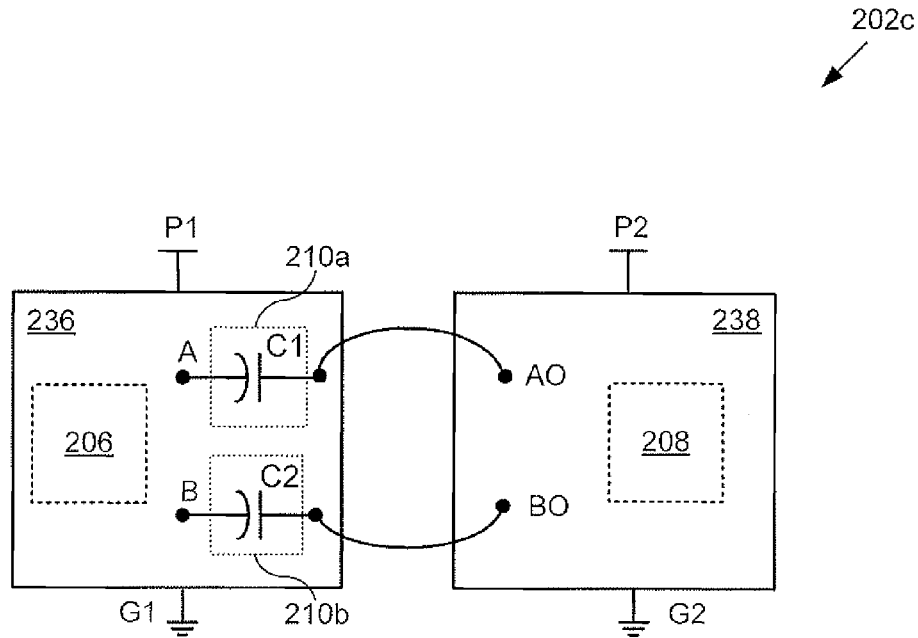
FIG. 2C presents a diagram of a level shifter having exemplary low and high voltage integrated circuits, in accordance with implementations of the present disclosure.
Figure 2D:
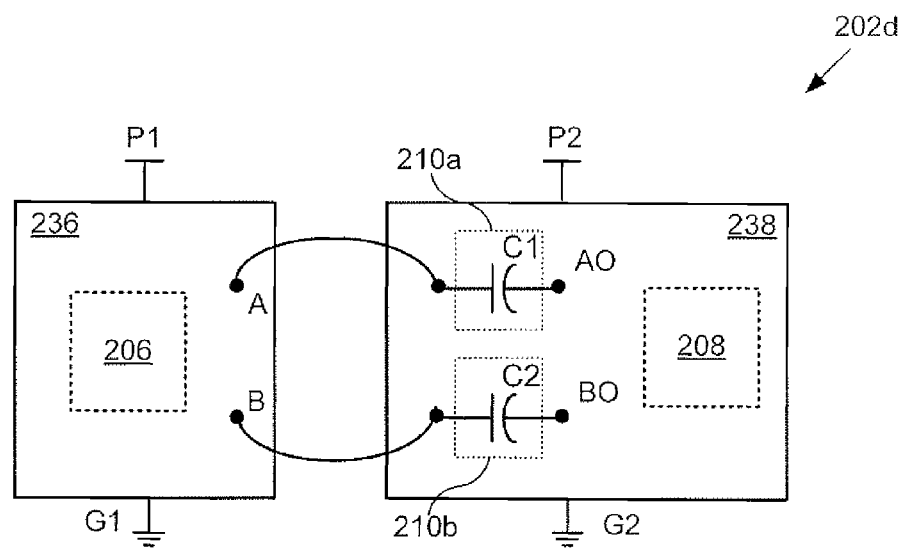
FIG. 2D presents a diagram of a level shifter having exemplary low and high voltage integrated circuits, in accordance with implementations of the present disclosure.

Alternatively, isolation barriers 210a and 210b can be completely on either of low and high voltage ICs 236 and 238. For example, in FIG. 2C, isolation barriers 210a and 210b are completely on low voltage IC 236. In FIG. 2D, isolation barriers 210a and 210b are completely on high voltage IC 238. In other implementations, one of isolation barriers 210a and 210b is completely on low voltage IC 236 and the other of isolation barriers 210a and 210b is completely on high voltage IC 238.

Figure 3:
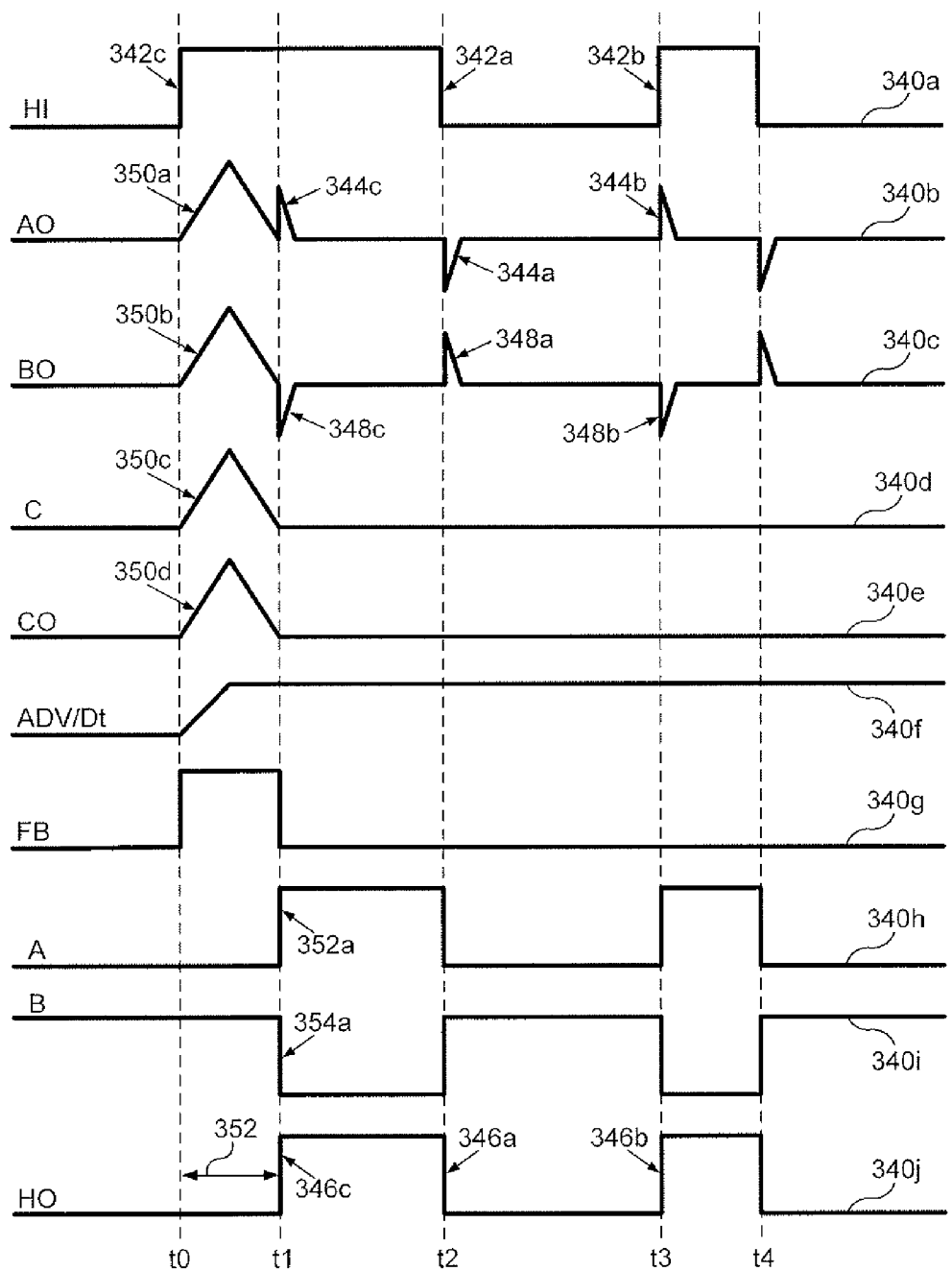
FIG. 3 presents exemplary waveforms of a system having a level shifter, in accordance with implementations of the present disclosure.

FIG. 3 presents exemplary waveforms of a system having a level shifter, in accordance with implementations of the present disclosure. In FIG. 3, waveforms 340a, 340b, 340c, 340d, 340e, 340f, 340g, 340h, 340i, and 340j correspond to waveforms of similarly labeled elements in FIG. 1B.

Referring again to FIGS. 1A and 1B with FIG. 3, as described above, common mode noise in system 100, and especially asynchronous common mode noise, can cause disruption, loss of functionality, and damage to system 100. FIG. 3 shows that level shifter 102 is level shifting input signal HI to output signal HO concurrently with asynchronous common mode noise ADV/Dt between times t0 and t1. Between times t1 and t4, level shifter 102 is level shifting input signal HI to output signal HO, but the influence of asynchronous common mode noise ADV/Dt has subsided.

Absent asynchronous common mode noise ADV/Dt, each edge of input signal HI is manifested as input signal spikes in complimentary signals AO and BO. As shown in FIG. 3, between times t2 and t4, complimentary signals A and B correspond to a differentiated version of input signal HI. Thus, falling edge 342a in waveform 340a is manifested as downward input signal spike 344a in waveform 340b and upward input signal spike 348a in waveform 340c. Furthermore, rising edge 342b in waveform 340a is manifested as upward input signal spike 344b in waveform 340b and downward input signal spike 348b in waveform 340b. Waveforms 340b and 340c have input signal spikes with opposing polarities due to the differential nature of complimentary signals A and B.

In high voltage circuit 108, regenerate logic 124 is configured to generate output signal HO where edges of output signal HO correspond substantially to the input signal spikes in waveforms 340b and 340c. As such, waveform 340j includes falling edge 346a corresponding to downward input signal spike 344a in waveform 340b and rising edge 346b corresponding to upward input signal spike 344b in waveform 340b. In doing so, output signal HO accurately corresponds to a level shifted version input signal HI while low and high voltage circuits 106 and 108 are galvanically isolated.

In level shifter 102, asynchronous common mode noise ADV/Dt and common mode noise in general is manifested as noise spikes having a common polarity in waveforms 340b, 340c, 340d, and 340e due to being each referenced to ground G2. For example, FIG. 3 shows common mode noise spikes 350a, 350b, 350c, and 350d having a common polarity. As corresponding input signal spikes in waveforms 340b and 340c have opposing polarities (e.g. downward input signal spike 344a and upward input signal spike 348a), in some implementations, high voltage circuit 108 can detect common mode noise spikes 350a and 350b as not being part of input signal HI based on common mode noise spikes 350a and 350b having a common polarity (negative or positive). As such, regenerate logic 124 may be configured to reject common mode noise by holding the state of output signal HO based on detecting common mode noise spikes 350a and 350b.

The aforementioned scheme of common mode noise detection may be suitable in many instances where common mode noise spikes in level shifter 102 are caused by synchronous common mode noise. However, in FIG. 3, common mode noise spikes 350a and 350b are caused by asynchronous common mode noise ADV/Dt. Thus, common mode noise spikes in level shifter 102 can occur in times substantially concurrent with edges of input signal HI. Such an occurrence is illustrated in FIG. 3 where common mode noise spikes 350a and 350b are swamping out edge 342c from waveforms 340b and 340c. As such, regenerate logic 124 may only detect asynchronous common mode noise ADV/Dt resulting in distortion 352 in output signal HO. As shown in FIG. 3, waveform 340j remains low at time to, whereas waveform 340a has edge 342c to transition high.

In level shifter 102, distortion in output signal HO can cause disruption, loss of functionality, and damage to system 100. Low voltage circuit 106 is configured to refresh differential signal 130 responsive to feedback signal FB. By refreshing differential signal 130, distortion 352 in waveform 340j is significantly reduced.

In level shifter 102, feedback signal FB is provided by feedback generator 122 of high voltage circuit 108 concurrently with common mode noise in level shifter 102. As shown in FIG. 3, level shifter 102 is configured such that asynchronous common mode noise ADV/Dt is manifested in waveforms 340d and 340e as common mode noise spikes 350c and 350d. Feedback detector 118 of low voltage circuit 106 is configured to detect feedback signal FB from common mode noise spike 350d. Thus, low voltage circuit 106 is configured to detect common mode noise in level shifter 102. Refresh logic 116 receives feedback signal FB and is configured to refresh differential signal 130 responsive to feedback signal FB. Thus, at time t1, waveforms 340h and 340i include respective input signal refresh edges 352a and 354a, which are refreshed versions of edge 342c of input signal HI. Input signal refresh edges 352a and 354a are manifested as input signal refresh spikes 344c and 348c in respective waveforms 340b and 340c. As such, regenerate logic 124 of high voltage circuit 108 can detect input signal refresh spikes 344c and 348c so as to generate edge 346c in output signal HO to end distortion 352 at time t1 rather than time t2.

Thus, in level shifter 102, feedback signal FB is provided by high voltage circuit 108 through isolation barrier 110c. As such, low voltage circuit 106 can provide differential signal 130 responsive to feedback signal FB from high voltage circuit 108 while being galvanically isolated therefrom. This can enable more accurate and robust level shifting of input signal HI. The present application emphasizes implementations where feedback signal FB indicates common mode noise in level shifter 102. However, feedback signal FB can indicate other conditions in system 100. As examples, feedback signal FB may indicate over current, over temperate, and/or over voltage conditions of high voltage circuit 108 and/or power supply 104. Furthermore, feedback signal FB may be based on signals provided to high voltage circuit 108 other than differential signal 130 (e.g. signals from power supply 104). Furthermore, in the present implementation, feedback signal FB is provided by high voltage circuit 108 through a capacitive isolation barrier (isolation barrier 110c). However, isolation barrier 110c need not be a capacitive isolation barrier. Exemplary approaches to galvanic isolation for level shifter 102 can be based on any combination of capacitance, induction, electromagnetic waves, and optical, acoustic, and mechanical means to exchange energy between low voltage circuit 106 and high voltage circuit 108.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A level shifter comprising:
   a low voltage circuit and a high voltage circuit;
   said low voltage circuit configured to provide a differential signal to said high voltage circuit;
   said high voltage circuit configured to receive said differential signal from said low voltage circuit so as to level shift said differential signal from a first ground of said low voltage circuit to a second ground of said high voltage circuit;
   wherein said differential signal is provided by said low voltage circuit responsive to a feedback signal from said high voltage circuit.

2. The level shifter of claim 1, wherein said feedback signal indicates common mode noise in said level shifter.

3. The level shifter of claim 1, wherein said low voltage circuit is configured to refresh said differential signal responsive to said feedback signal.

4. The level shifter of claim 1, wherein said feedback signal is provided by said high voltage circuit concurrently with common mode noise in said level shifter.

5. The level shifter of claim 1, wherein said high voltage circuit is configured to reject common mode noise in said level shifter.

6. The level shifter of claim 1, wherein said feedback signal is provided by said high voltage circuit through a capacitive isolation barrier.

7. The level shifter of claim 1, wherein said feedback signal is provided by said high voltage circuit through a dedicated isolation barrier.

8. The level shifter of claim 1, wherein said feedback signal and said differential signal are communicated through at least one shared isolation barrier.

9. The level shifter of claim 1, wherein said low voltage circuit is configured to detect said feedback signal from a common mode noise spike.

10. A low voltage circuit of a level shifter, said low voltage circuit being configured to:

provide a differential signal to a high voltage circuit so as to level shift said differential signal from a first ground of said low voltage circuit to a second ground of said high voltage circuit;

wherein said differential signal is provided by said low voltage circuit responsive to a feedback signal from said high voltage circuit.

11. The low voltage circuit of claim 10, wherein said feedback signal indicates common mode noise in said level shifter.

12. The low voltage circuit of claim 10, wherein said low voltage circuit is configured to refresh said differential signal responsive to said feedback signal.

13. The low voltage circuit of claim 10, wherein said feedback signal is provided to said low voltage circuit through a capacitive isolation barrier.

14. The low voltage circuit of claim 10, wherein said feedback signal is provided to said low voltage circuit through a dedicated isolation barrier.

15. The low voltage circuit of claim 10, wherein said feedback signal and said differential signal are communicated through a at least one shared isolation barrier.

16. The low voltage circuit of claim 10 comprising a feedback detector configured to detect said feedback signal from said high voltage circuit.

17. The low voltage circuit of claim 10, wherein said low voltage circuit is configured to detect said feedback signal from a common mode noise spike.

18. A high voltage circuit of a level shifter, said high voltage circuit being configured to:

receive a differential signal from a low voltage circuit so as to level shift said differential signal from a first ground of said low voltage circuit to a second ground of said high voltage circuit;

provide a feedback signal to said low voltage circuit.

19. The high voltage circuit of claim 18, wherein said feedback signal indicates common mode noise in said level shifter.

20. The high voltage circuit of claim 18, wherein said feedback signal is provided by said high voltage circuit concurrently with common mode noise in said level shifter.

* * * * *